(12) United States Patent
Lee et al.

(10) Patent No.: US 10,314,187 B2
(45) Date of Patent: Jun. 4, 2019

(54) STORAGE MEDIUM ACCOMMODATION DEVICE AND ELECTRONIC DEVICE INCLUDING THE SAME

(71) Applicant: Samsung Electronics Co., Ltd., Gyeonggi-do (KR)

(72) Inventors: Sung-Young Lee, Gyeongsangbuk-do (KR); Dong-Jin Seo, Gyeongsangbuk-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/805,498

(22) Filed: Nov. 7, 2017

(65) Prior Publication Data

US 2018/0132369 A1    May 10, 2018

(30) Foreign Application Priority Data

Nov. 8, 2016    (KR) ..................... 10-2016-0148319

(51) Int. Cl.
*H04B 1/3818*    (2015.01)
*H04B 1/3816*    (2015.01)
(Continued)

(52) U.S. Cl.
CPC ......... *H05K 5/0291* (2013.01); *G06F 1/1658* (2013.01); *H04B 1/3818* (2015.01);
(Continued)

(58) Field of Classification Search
CPC ...... H04B 1/3818; H04B 1/03; H04B 1/3816; H04B 1/08; H04M 1/026; H04M 1/0249;
(Continued)

(56) References Cited

U.S. PATENT DOCUMENTS 7,798,840 B2    9/2010    Hubert et al.
9,853,671 B2 *  12/2017    Myers .................. H04B 1/3818
(Continued)

FOREIGN PATENT DOCUMENTS

JP    2010-177215 A    8/2010
JP    2015-146472 A    8/2015
(Continued)

OTHER PUBLICATIONS

International Search Report dated Mar. 8, 2018.

*Primary Examiner* — Andrew Wendell
(74) *Attorney, Agent, or Firm* — Cha & Reiter, LLC

(57) ABSTRACT

According to various embodiments of the present disclosure, there is provided a storage medium accommodation device and an electronic device including the same. The storage medium accommodation device may include: a head; a first tray withdrawably introduced into an electronic device and configured to accommodate a first storage medium; a second tray provided between the head and the first tray to be withdrawably introduced into the electronic device, and configured to accommodate a second storage medium; first and second guides respectively provided on the first and second trays, and moved in a sliding manner such that the first and second trays can be introduced into/drawn out from the electronic device; and locking portions respectively included in the first and second guides and configured to restrict the sliding movement of the first and second guides such that the first and second trays can be selectively introduced/drawn out. Other embodiments may also be made.

17 Claims, 17 Drawing Sheets

(51) Int. Cl.
*H04M 1/675* (2006.01)
*H04M 3/38* (2006.01)
*H05K 5/02* (2006.01)
*H05K 7/14* (2006.01)
*G06F 1/16* (2006.01)
*G06F 3/147* (2006.01)
*H04M 1/02* (2006.01)

(52) U.S. Cl.
CPC ......... *H05K 5/0295* (2013.01); *H05K 7/1401* (2013.01); *H05K 7/1418* (2013.01); *G06F 3/147* (2013.01); *H04M 1/026* (2013.01)

(58) Field of Classification Search
CPC .... H04M 1/675; H04M 3/387; H05K 5/0291; H05K 7/1418; H05K 5/0295; H05K 7/1401; G06F 3/147; G06F 7/003; G06F 13/0825; G06F 13/0831; H01R 13/629
See application file for complete search history.

(56) References Cited

U.S. PATENT DOCUMENTS

| | | | |
|---|---|---|---|
| 2006/0091767 A1 | 5/2006 | Chaloner et al. | |
| 2010/0234070 A1* | 9/2010 | Li | G06K 7/0021 455/558 |
| 2012/0309213 A1* | 12/2012 | Lai | G06K 13/08 439/159 |
| 2016/0113142 A1 | 4/2016 | Moon et al. | |
| 2016/0164204 A1 | 6/2016 | Cho et al. | |
| 2016/0164226 A1* | 6/2016 | Hirata | H04B 1/3816 439/155 |
| 2016/0266619 A1 | 9/2016 | Heiskanen | |
| 2017/0162982 A1* | 6/2017 | Wu | H04B 1/3816 |

FOREIGN PATENT DOCUMENTS

| | | |
|---|---|---|
| KR | 1019980051001 A | 9/1998 |
| KR | 10-2016-0045284 A | 4/2016 |
| WO | 2014062312 A1 | 4/2014 |

* cited by examiner

STORAGE MEDIUM ACCOMMODATION DEVICE AND ELECTRONIC DEVICE INCLUDING THE SAME

CLAIM OF PRIORITY

This application claims the priority under 35 U.S.C. § 119(a) to Korean Application Ser. No. 10-2016-0148319, which was filed in the Korean Intellectual Property Office on Nov. 8, 2016, the entire content of which is hereby incorporated by reference.

TECHNICAL FIELD

Various embodiments of the present disclosure relate to an electronic device, for example, an electronic device that includes a storage medium accommodation device.

BACKGROUND

An electronic device is a device that performs a specific function according to a program provided therein, such as an electronic scheduler, a portable multimedia reproducer, a mobile communication terminal, a tablet PC, an image/sound device, a desktop/laptop PC, or a vehicular navigation system, including a home appliance. For example, such an electronic device may output information stored therein as sound or an image. In addition, portable electronic devices, such as a laptop computer, a tablet PC, an electronic scheduler, a portable multimedia player, and a mobile communication terminal, are generally equipped with a display device and a battery. Portable electronic devices, such as an electronic scheduler, a portable multimedia reproducer, a mobile communication terminal, and a tablet PC, are generally equipped with a display device and a battery, and have a bar-type, folder-type, or sliding-type appearance.

SUMMARY

An electronic device may utilize a storage medium, such as a Subscriber Identification Module (SIM) card or a memory card, for expanding a security-related functions, such as those pertaining to user authentication, or storage capacity. The electronic device may be provided with a socket, and a tray accommodating a storage medium may be mounted in the socket. Further, in the electronic device, a hole may be formed for the withdrawal of such a tray from the electronic device.

Certain embodiments may allow a SIM card and a memory card to be introduced and withdrawn from same opening while permitting replacement of the memory card without uninstalling the SIM card. Allowing the SIM card and memory card to be withdrawn from the same opening advantageously saving "real estate" on the smartphone. Additionally, allowing selecting replacement of memory card without uninstalling the SIM card allows the electronic device to maintain continuous and generally seamless operation.

A tray provided in an electronic device may simultaneously accommodate a SIM card and a memory card therein. When a user separates the tray from the socket and draws the tray out of a housing in order to replace the memory card, the SIM card may also be separated from the socket. When the SIM card is separated from the socket, inconvenience may arise since it becomes necessary to reboot the electronic device.

In the electronic device according to various embodiments of the present disclosure, when the tray accommodating the SIM card and the memory card together is drawn out of the housing, it is intended to replace only the memory card while maintaining the state in which the SIM card is connected to the socket. In the electronic device according to various embodiments of the present disclosure, it is intended to maintain the state in which the SIM card is connected to the electronic device even in the process of replacing the memory card, thereby preventing the electronic device from rebooting.

According to various embodiments of the present disclosure, there is provided a storage medium accommodation device that is detachable from/attachable to an electronic device. The storage medium accommodation device may include: a head; a first tray withdrawably introduced into an electronic device and configured to accommodate a first storage medium; a second tray provided between the head and the first tray to be withdrawably introduced into the electronic device, and configured to accommodate a second storage medium; first and second guides respectively provided on the first and second trays, and moved in a sliding manner such that the first and second trays can be introduced into/drawn out from the electronic device; and locking portions respectively included in the first and second guides and configured to restrict the sliding movement of the first and second guides such that the first and second trays can be selectively drawn out.

According to various embodiments of the present disclosure, there is provided an electronic device that includes a housing including an opening, a socket provided inside the housing, and a storage medium accommodation device detachably coupled to the socket through the opening. The storage medium accommodation device may include: a head; a first tray withdrawably introduced into the socket and configured to accommodate a first storage medium; a second tray provided between the head and the first tray to be withdrawably introduced into the socket, and configured to accommodate a second storage medium; first and second guides respectively provided on the first and second trays, and moved in a sliding manner such that the first and second trays can be withdrawably introduced into the socket; and locking portions respectively included in the first and second guides and configured to restrict the sliding movement of the first and second guides such that the first and second trays can be selectively introduced/drawn out.

According to various embodiments of the present disclosure, there is provided a method of operating an electronic device that includes a storage medium. The method may include: sliding the first tray relative to a second tray; drawing the first tray out of the housing; maintaining the second tray in the state of being accommodated in the housing; and replacing the first storage medium accommodated in the first tray.

According to various embodiments of the present disclosure, there is provided an electronic device comprising: a housing including an opening; a SIM card removably connected to the electronic device through insertion in the opening; an SD memory card removably connected to the electronic device through insertion in the opening, wherein the opening that the memory card is removably connected through insertion is the same opening that the SIM card is removably connected through insertion; one or more processors configured to access cellular services using the SIM card while the SD memory card is removably connected to the electronic device; and wherein the one or more processors are configured to continue access of the cellular services when the SD memory card is removed from the electronic device.

In the storage medium accommodation device according to various embodiments of the present disclosure, it is possible to maintain the state in which the second storage medium is mounted in the housing while the first storage medium is drawn out of the housing since the second tray is slid relative to the first tray.

In the electronic device including the storage medium accommodation device according to the various embodiments of the present disclosure, it is possible to prevent the electronic device from unnecessarily rebooting since the second storage medium remains connected with the electronic device in the process of replacing the first storage medium.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
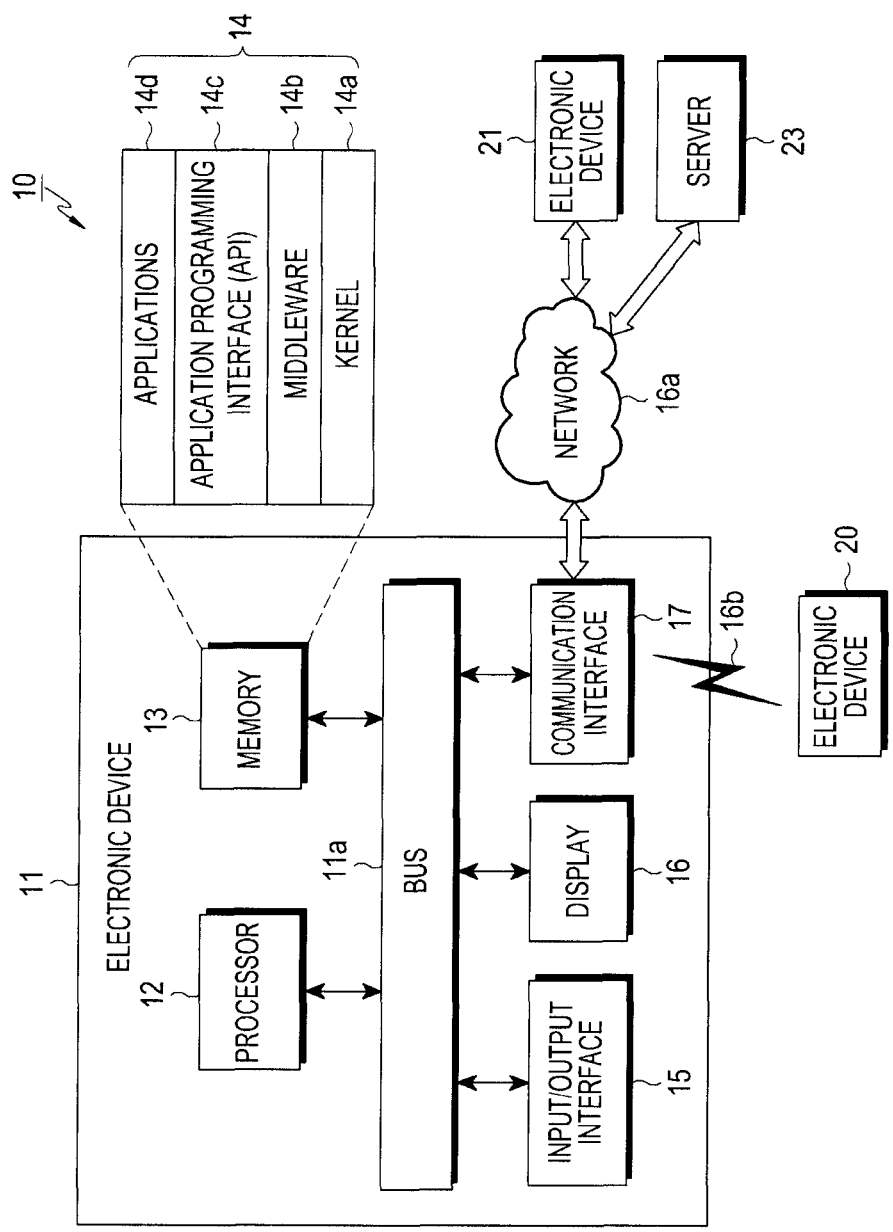
FIG. 1 is a view illustrating a network environment that includes an electronic device according to one of various embodiments of the present disclosure.

Hereinafter, various embodiments of the present disclosure will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In the description of the drawings, similar reference numerals may be used to designate similar elements.

In the present disclosure, the expression "have", "may have", "include" or "may include" refers to existence of a corresponding feature (e.g., numerical value, function, operation, or components such as elements), and does not exclude existence of additional features.

In the various embodiments of the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The terms used in the present disclosure are only used to describe specific embodiments, and are not intended to limit the present disclosure. A singular expression may include a plural expression unless they are definitely different in a context. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, eve the terms defined herein may not be construed to exclude embodiments of the present disclosure.

FIG. 1 is a view illustrating a network environment that includes an electronic device according to one of various embodiments of the present disclosure.

Descriptions will be made of an electronic device 11 within a network environment 10 in various embodiments with reference to FIG. 1. The electronic device 11 may include a bus 11a, a processor 12, a memory 13, an input/output interface 15, a display 16, and a communication interface 17. In a certain embodiment, at least one of the above-mentioned components may be omitted from the electronic device 11, or the electronic device may be additionally provided with other components. For example, in certain embodiments, the electronic device 100 can include sensor(s). The bus 11a may include a circuit that interconnects the above-mentioned components 11 to 17 and supports communication (e.g., a control message or data) between the components 11 to 17.

The processor 12 may include one or more of a Central Processing Unit (CPU), an Application Processor (AP), and a Communication Processor (CP). The processor 12 may execute, for example, an arithmetic operation or data processing that is related to a control and/or communication of one or more other components of the electronic device 11. In certain embodiments, the processor 12 can be configured to receive an interrupt from the sensor(s). The sensors can provide interrupts based on various detected conditions, including removal or removable memory. As will be described in greater detail, the memory 13 can include removable memory. When the removable memory is removed, a sensor detects this condition and generates an interrupt to the processor 12. In response to receiving an interrupt, the processor 12 executes an interrupt handler which will be described in greater detail below.

Further, in certain embodiments, after removable of a removable memory, the processor 12 continues to operate and cause the electronic device to receive cellular services using a SIM card as will be described in greater detail below.

The memory 13 may include a volatile memory and/or a non-volatile memory. Additionally, memory 13 can include non-removable memory and removable memory. The term "removable" shall be understood to mean removable without destruction of the connected parts, such that the connected parts can be reconnected after removal in the same manner that the parts were connected before removal.

The removable memory can include a Subscriber Identity Module (SIM) card and a Secure Digital (SD) card (or micro-SD card, for purposes of this document, SD card shall be understood to include either an SD card or a micro SD-card). The SIM card can be a smart card inside a mobile phone, carrying an identification number unique to the owner, and stores personal data. Removable of the SIM card can result in preventing the electronic device from receiving services from a cellular network, such as phone calling, and receiving SMS messages. The SD card allows for expansion of memory space and can be used to store a variety of data files (such as audio files, pictures, and video files) which the user may wish to port to other electronic devices. The user can port the data files on the SD card to another electronic device by removing the SD card and inserting the SD card in another electronic device.

As will be shown in greater detail below, both the SIM card and the SD card can be withdrawably introduced into the electronic device using the same ingress/egress.

The memory 13 may store, for example, commands or data that are related to one or more other components of the electronic device 11. According to one embodiment, the memory 13 may store software and/or a program 14. The program 14 may include, for example, a kernel 14a, a middleware 14b, an Application Programming Interface (API) 14c, and/or an application program (or an "application") 14d. At least one of the kernel 14a, the middleware 14b, and the API 14c may be referred to as an Operating System (OS). The kernel 14a may control or manage, for example, system resources (e.g., the bus 11a, the processor 12, or the memory 13) that are used for executing operations or functions implemented in the other programs (e.g., the middleware 14b, the API 14c, or the application programs 14d). In addition, the kernel 14a may provide an interface that allows the middleware 14b, the API 14c, or the application programs 14d to access individual components of the electronic device 11 so as to control or manage the system resources. Additionally, the kernel or middleware may include an interrupt handler that is executed by the processor, responsive to the sensor detecting that the removable memory is removed. Among other things, when the processor 12 executes the interrupt handler, the processor 12 can cause the display 16 to display a textual or graphical message on the screen indicating that the removable memory is removed.

The middleware 14b may play an intermediary role such that, for example, the API 14c or the application programs 14d may communicate with the kernel 14a so as to exchange data. In addition, the middleware 14b may process one or more task requests, which are received from the application programs 14d, according to priority. For example, the middleware 14b may assign the priority capable of using a system resource of the electronic device 11 (e.g., the bus 11a, the processor 12, or the memory 13) to at least one of the application programs 14d, and may process the one or more task requests. The API 14c is an interface that allows the application programs 14d to control functions provided from the kernel 14a or the middleware 14b, and may include, for example, one or more interfaces or functions (e.g., commands) for a file control, a window control, an image processing, or a character control. The input/output interface 15 may transmit commands or data, which are entered from, for example, a user or any other external device, to the other component(s) of the electronic device 11, or may output commands or data, which are received from the other component(s) of the electronic device 11, to the user or the other external device.

The display device 16 may include, for example, a Liquid Crystal Display (LCD), a Light Emitting Diode (LED) display, an Organic Light Emitting Diode (OLED) display, a MicroElectroMechanical System (MEMS) display, or an electronic paper display. The display 16 may display various contents (e.g., text, image, video, icon, or symbol) to, for example, the user. The display 16 may include a Display Driver IC (DDI) that generates a signal to drive the display.

According to various embodiments, the DDI may be electrically connected to the display 16.

The communication interface 17 may set, for example, communication between the electronic device 11 and an external device (e.g., a first external electronic device 20, a second external device 21, or a server 23). For example, the communication interface 17 may be connected with a network 16*a* through wired or wireless communication so as to communicate with the external device (e.g., the second external electronic device 21 or the server 23).

The wireless communication may include cellular communication that uses at least one of, for example, Long-Term Evolution (LTE), LTE Advance (LTE-A), Code Division Multiple Access (CDMA), Wideband CDMA (WCDMA), Universal Mobile Telecommunication System (UMTS), Wireless Broadband (WiBro), and Global System for Mobile communication (GSM). According to one embodiment, the wireless communication may include at least one of, for example, Wireless Fidelity (Wi-Fi), Bluetooth, Bluetooth Low Energy (BLE), ZigBee, Near Field Communication (NFC), Magnetic Secure Transmission, Radio Frequency (RF), and Body Area Network (BAN). According to one embodiment, the wireless communication may include GNSS. The GNSS may include, for example, at least one of Global Positioning System (GPS), Global Navigation Satellite System (Glonass), Beidou Navigation Satellite System (hereinafter, "Beidou"), Galileo, and the European global satellite-based navigation system, according to, for example, a use area or band width. Herein, "GPS" may be interchangeably used with "GNSS" below. The wired communication may use at least one of, for example, Universal Serial Bus (USB), High Definition Multimedia Interface (HDMI), Recommended Standard 232 (RS-232), and Plain Old Telephone Service (POTS). The network 16*a* may include a telecommunication network (e.g., at least one of a computer network (e.g., LAN or WAN), the Internet, and a telephone network).

In certain embodiments the electronic device is capable of receiving services from a cellular network, such as making a non-emergency phone call, receiving texts, and accessing the internet directly (as opposed to accessing through Wi-Fi), while the SD card is removed, and replaced with another SD card. This is due to the fact that although the SD card and the SIM card are withdrawably introduced (capable of introduction into and withdrawal) into the electronic device using the same ingress/egress, the SD card can be removed and replaced while the SIM card is not removed.

Each of the first and second external electronic devices 20 and 21 may be of a type that same as or different from that of the electronic device 11. According to various embodiments, all or some of the operations to be executed by the electronic device 11 may be executed by another electronic device or a plurality of other electronic devices (e.g., the electronic devices 20 and 21 or the server 23). According to one embodiment, in the case where the electronic device 11 should perform a certain function or service automatically or upon request, the electronic device 11 may request some functions or services that are associated therewith from the other electronic devices (e.g., the electronic devices 20 and 21 or the server 23), instead of or in addition to executing the functions or service by itself. The other electronic devices (e.g., the electronic devices 20 and 21 or the server 23) may execute the requested functions or additional functions, and may deliver the results to the electronic device 11. The electronic device 11 may provide the requested functions or services by processing the received results as they are or additionally. For this purpose, for example, a cloud computing technique, a distributed computing technique, or a client-server computing technique may be used.

Figure 2:
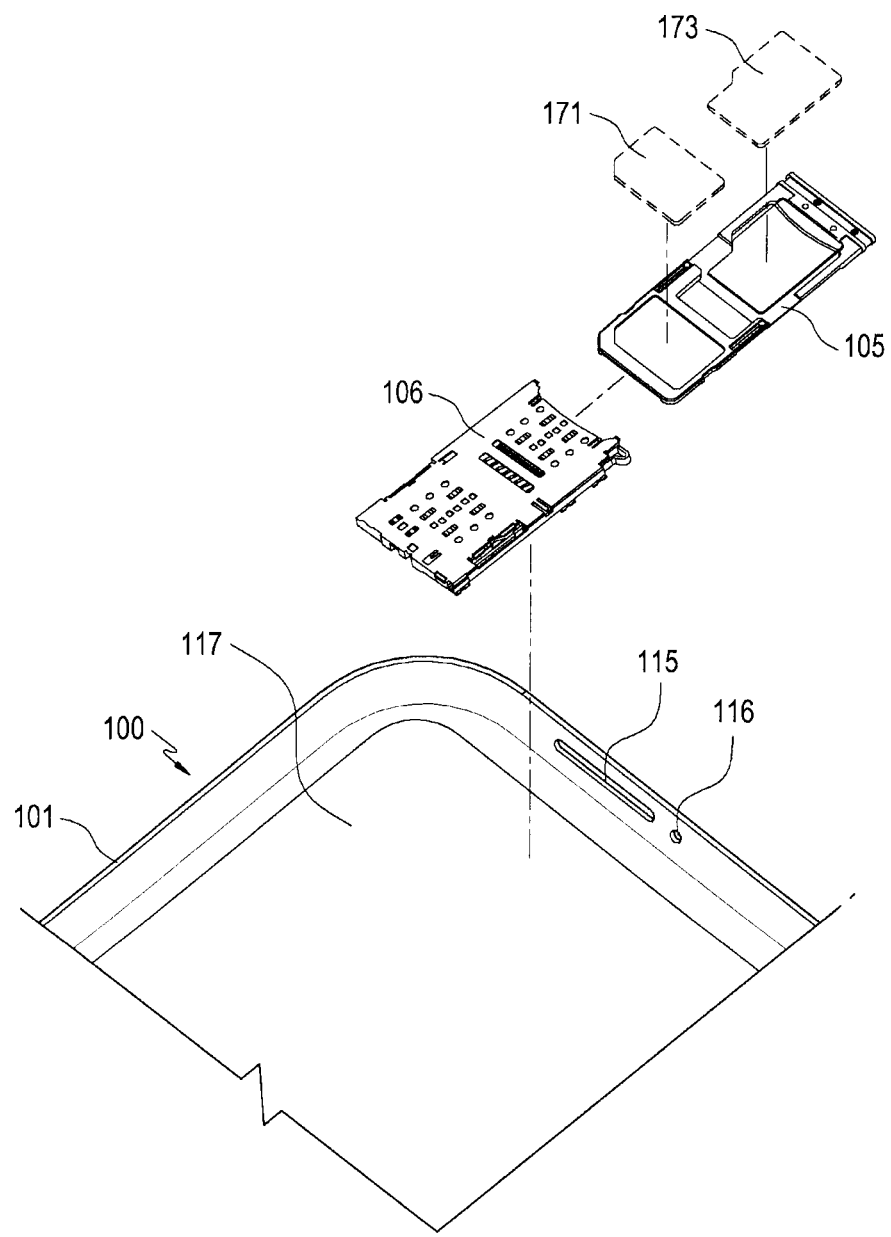
FIG. 2 is a perspective view illustrating a portion of an electronic device according to one of various embodiments of the present disclosure.

FIG. 2 is a perspective view illustrating a portion of an electronic device according to one of various embodiments of the present disclosure.

Referring to FIG. 2, according to one of various embodiments of the present disclosure, an electronic device 100 may include a housing 101, a circuit board 117, a socket 106, and a storage medium accommodation device 105.

An opening 115 may be formed in the top side of the housing 101, so that the storage medium accommodation device 105 may be withdrawably introduced through the opening 115. In certain embodiments, the opening 115 can be the ingress/egress through which two or more removable memory cards, such as a SIM card and an SD card can be withdrawably introduced. In the top side of the housing 101, a hole 116, which is smaller than the opening 115, may be formed adjacent to the opening 115. The hole 116 may be a hole that may be manipulated so as to allow the storage medium accommodation device 105 to be drawn out through the opening 115.

The circuit board 117 may be mounted on an inner face of the housing 101.

The socket 106 may be connected to the circuit board 117. The storage medium accommodation device 105 may be inserted into the socket 106 so as to be detachably coupled to the socket 106. For example, the storage medium accommodation device 105 can be withdrawably introduced into the socket 106.

The storage medium accommodation device 105 may be inserted into the socket 106 in the state of accommodating storage mediums 171 and 173. A detailed description of the storage medium accommodation device 105 will follow. In some embodiments, the storage medium accommodation device 105 can further include a sensor that detects the state of the storage medium accommodation device 105. In other, the sensor can be located in the socket 106.

Figure 3:
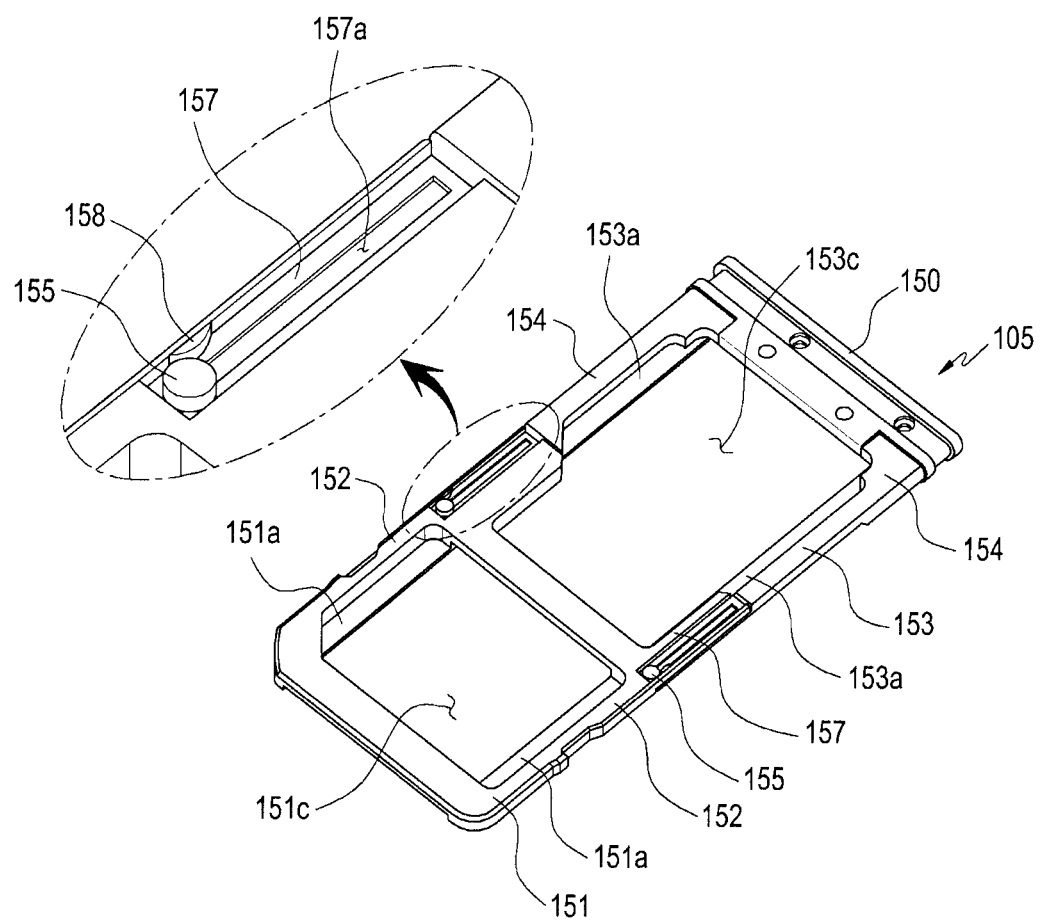
FIG. 3 is a perspective view illustrating a storage medium accommodation device according to one of various embodiments of the present disclosure.

FIG. 3 is a perspective view illustrating a storage medium accommodation device according to one of various embodiments of the present disclosure.

Referring to FIG. 3, the storage medium accommodation device 105 according to one of various embodiments of the present disclosure may accommodate a storage medium and may be detachably coupled to the inside of the housing 101 (FIG. 2) of the electronic device from the outside of the housing 101 (FIG. 2). The storage medium accommodation device 105 according to one of the various embodiments of the present disclosure may include a head 150, a first tray 151, a second tray 153, a first guide 152, a second guide 154, and locking portions 158 and 155.

The storage medium accommodation device 105 may include a head 150 which may be gripped by a user's hand or a tool.

The first tray 151 may provide a first accommodation space 151*c* capable of accommodating the first storage medium. The first storage medium may be, for example, a SIM card. The first tray 151 may be provided with a first seating portion 151*a* in the accommodation space so as to form a portion of the bottom face of the first tray 151. The first seating portion 151*a* may close a portion of the first accommodation space 151*c* so as to support the first storage medium accommodated in the first accommodation space 151*c*. For example, the first storage medium may be accommodated in the first accommodation space 151*c* while being supported by the first seating portion 151*a*.

The second tray 153 may be disposed between the head 150 and the first tray 151. According to various embodiments of the present disclosure, the second tray 153 may be fabricated integrally with the head. The second tray 153 may provide a second accommodation space 153*c* capable of accommodating the second storage medium. The second storage medium may be a memory card, such as a Secure Digital (SD) card or a micro SD card. The second tray 153 may be provided with a second seating portion 153*a* in the accommodation space so as to form a portion of the bottom face of the second tray 153. The second seating portion 153*a* may close or obstruct a portion of the second accommodation space 153*c* so as to support the second storage medium accommodated in the second accommodation space 153*c*. For example, the second storage medium may be accommodated in the second accommodation space 153*c* while being supported by the second seating portion 153*a*.

The head 150 and the first and second trays 151 and 153 may be made of a plastic material (e.g., a polycarbonate). According to various embodiments of the present disclosure, the head 150 may be made of a metallic material without being limited to the plastic material. According to various embodiments of the present disclosure, the head 150 may be made of a metallic material, and the first and second trays 151 and 153 may be made of a plastic material.

The first guide 152 may be provided to the first tray 151. The first guide 152 may be slid such that the first tray 151 is capable of being withdrawably introduced into the electronic device.

The second guide 154 may be provided to the second tray 153. The second guide 154 may be slid such that the second tray 153 is capable of being introduced into/drawn out of the electronic device.

The first guide 152 may include a slit 157*a* formed in the longitudinal direction of the first guide 152.

The locking portions 158 and 155 may limit the sliding movement of the first and second guides 152 and 154. The locking portions 158 and 155 may include a first locking portion 158 provided on the first guide 152 and a second locking portion 155 provided on the second guide 154.

The second locking portion 155 may be formed to protrude from one face of the second tray 153. The second locking portion 155 may be accommodated in the slit 157*a* so as to be slid along the slit 157*a*.

According to various embodiments of the present disclosure, the second tray 153 may include the second guide including a slit, and the first tray 151 may include a first locking portion formed to protrude. The first locking portion 158 may protrude toward the slit 157*a* of the first guide. The first locking portion 158 may maintain the second guide 154 in the locked state on the first guide 152.

Figure 4:
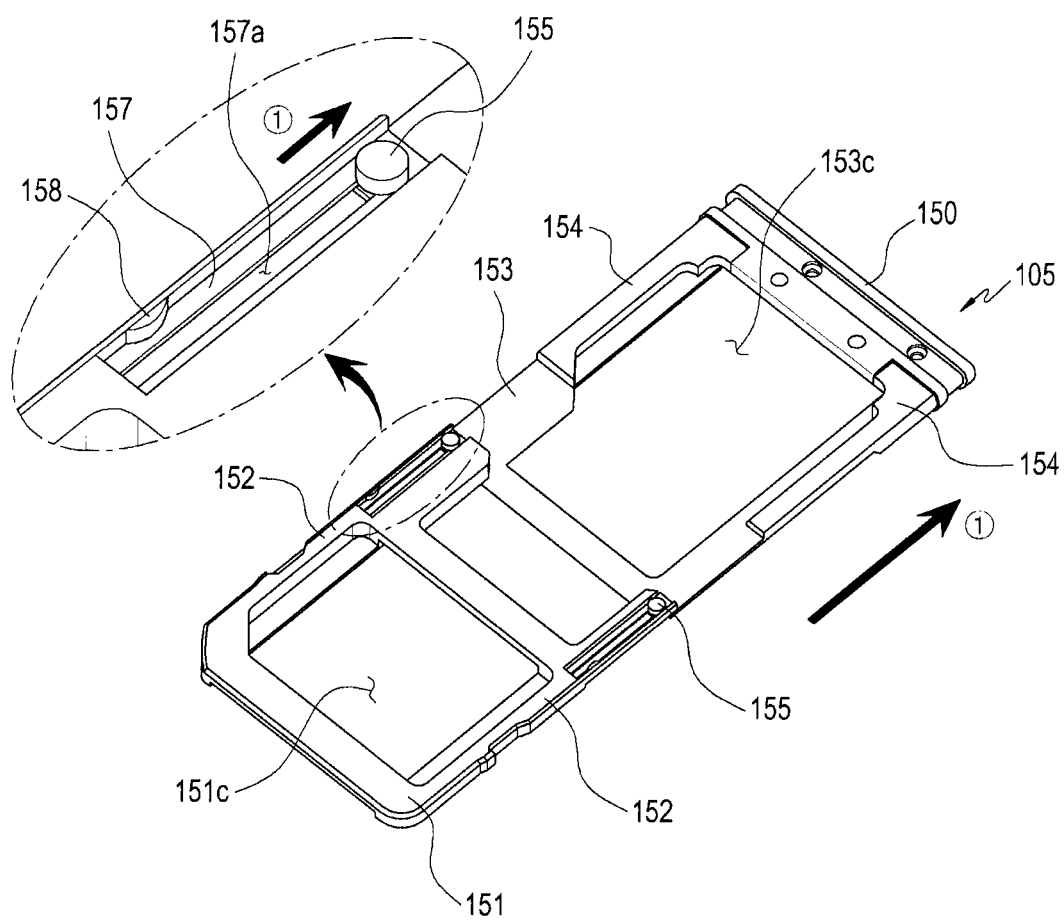
FIG. 4 is a perspective view illustrating a state in which a second tray has been moved in a sliding manner in the storage medium accommodation device according to one of various embodiments of the present disclosure.

FIG. 4 is a perspective view illustrating a state in which a second tray has been moved in a sliding manner in the storage medium accommodation device according to one of various embodiments of the present disclosure.

Referring to FIG. 4, the second tray 153 of the storage medium accommodation device 105 according to one of the various embodiments of the present disclosure may be slid relative to the first tray 151.

When the second tray 153 receives a first external force in a first direction (marked with the symbol "①"), the second locking portion 155 may be unlocked from the first locking portion 158. The first direction ① may be a direction in which the second tray 153 is directed from the inside to the outside of the electronic device. The second locking portion 155 may be slid in the first direction ① along the slit 157*a* by the first external force.

The second tray 153 may be slid relative to the first tray 151 together with the second locking portion 155.

In certain embodiments, the storage medium accommodation device 105 can include a sensor that detects whether the second locking portion 155 is on the side of the first locking portion 158 that is proximate to the electronic device or away from the electronic device (e.g., in direction "①"). If the second locking portion 155 is on the side of the first locking portion 158 that is away from the electronic device, the sensor can generate the interrupt to the processor.

Figure 5:
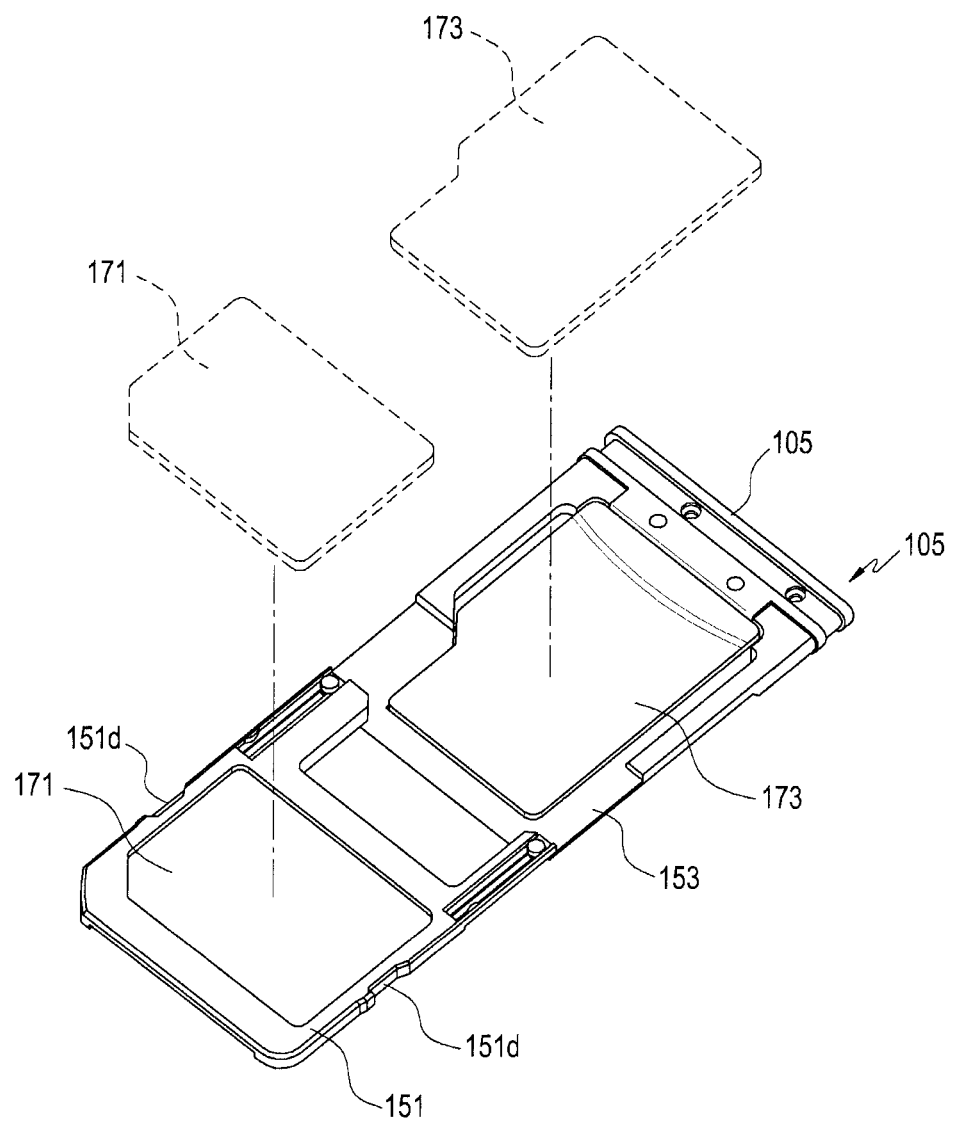
FIG. 5 is a perspective view illustrating a state in which first and second storage mediums are accommodated in the storage medium accommodation device according to one of various embodiments of the present disclosure.

FIG. 5 is a perspective view illustrating a state in which first and second storage mediums are accommodated in the storage medium accommodation device according to one of various embodiments of the present disclosure.

Referring to FIG. 5, the storage medium accommodation device 105 according to one of the various embodiments of the present disclosure may accommodate the first storage medium 171 and the second storage medium 173.

The first storage medium 171 may be accommodated in the first tray 151, and the second storage medium 173 may be accommodated in the second tray 153.

The first tray 151 may include a latching recess 151*d* formed in the socket 106 (FIG. 5) to be described later. The first tray 151 may be engaged with the socket 106 even if the second tray 153 is slid by the first external force.

As the second tray 153 is slid relative to the first tray 151, the second storage medium 173 accommodated in the second tray 153 may be spaced away from the first storage medium 171.

In certain embodiments, the first storage medium 171 can be a SIM card, while the second storage medium 173 can be an SD card.

Figure 6:
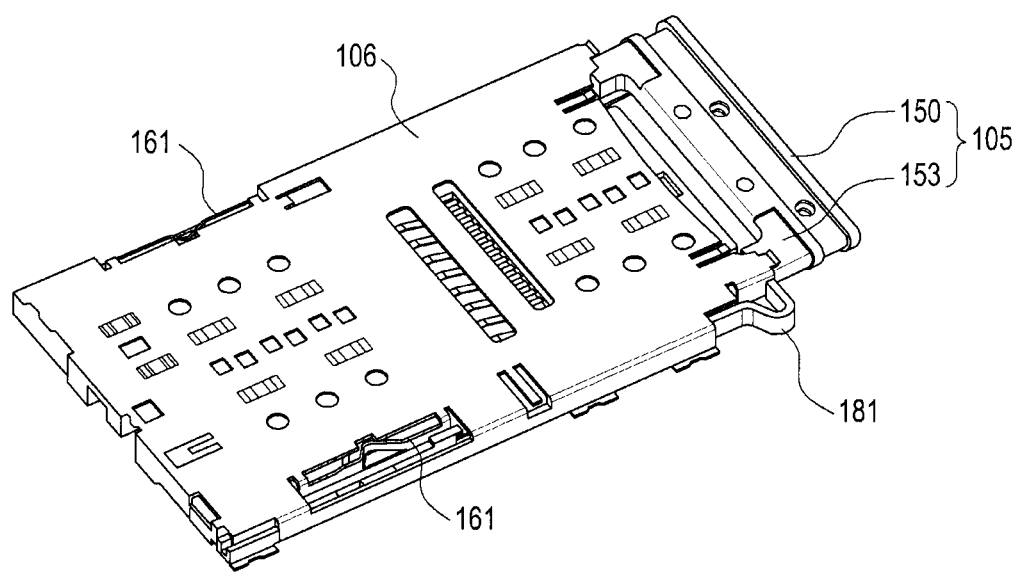
FIG. 6 is a perspective view illustrating a state in which the storage medium accommodation device according to one of various embodiments of the present disclosure is mounted in a socket.

FIG. 6 is a perspective view illustrating a state in which the storage medium accommodation device according to one of various embodiments of the present disclosure is mounted in a socket.

Referring to FIG. 6, the storage medium accommodation device 105 according to one of various embodiments of the present disclosure may be mounted in the socket 106.

The socket 106 may be mounted in the housing of the electronic device. The socket 106 may include connection terminals to be connected to the first and second storage mediums 171 and 173 (FIG. 5). The socket 106 may include the third locking portion 161 inserted into the latching recess 151*d* (FIG. 5). The third locking portion 161 may be formed to protrude such that the third locking portion 161 may be inserted into the latching recess 151*d* (FIG. 5) while being elastically deformed. The movement of the first tray 151 may be restricted within the socket 106 in a state where the third locking portion 161 is inserted into the latching recess 151*d* (FIG. 5).

According to one embodiment of the present disclosure, the socket 106 may be provided with a push bar 181 that transmits the first external force to the second tray 153. As the push bar 181 is moved in the longitudinal direction, the second tray 153 may be drawn out of the socket 106. The first tray 151 may be maintained in the state in which its movement is restricted within the socket 106 even if the first external force is transmitted to the second tray 153.

Figure 7:
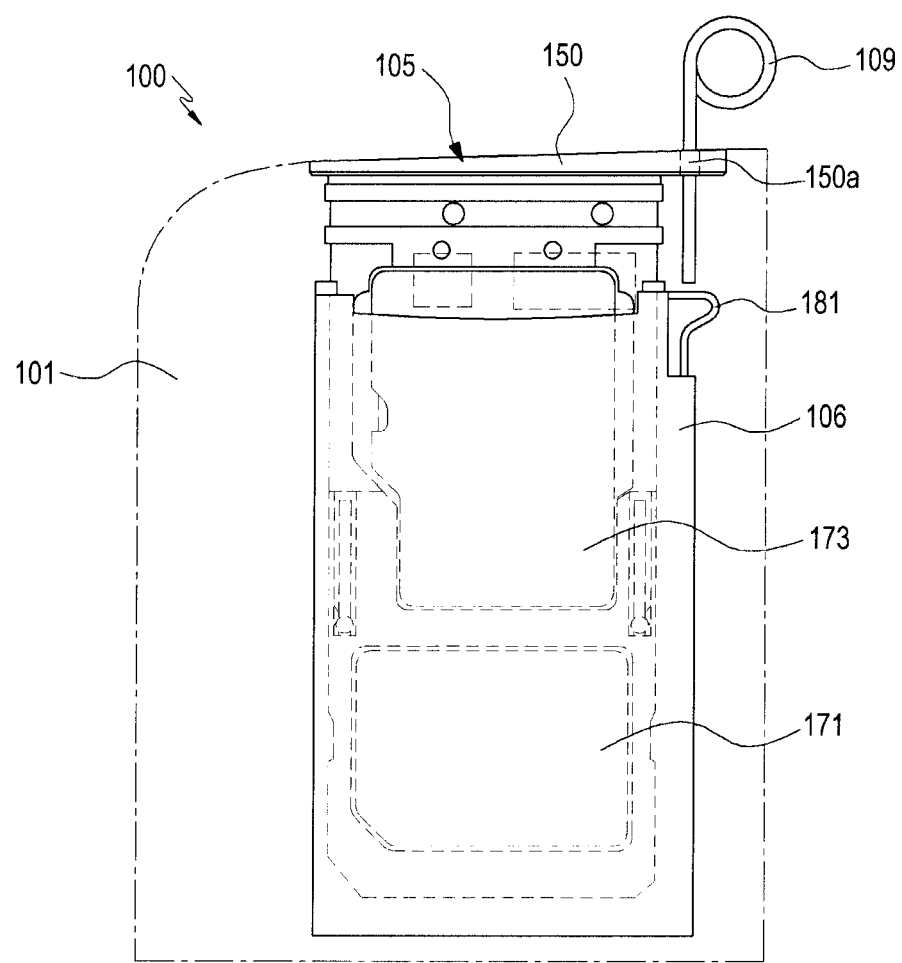
FIG. 7 is a perspective view illustrating a state in which the storage medium accommodation device is accommodated in an electronic device according to one of various embodiments of the present disclosure.
Figure 8:
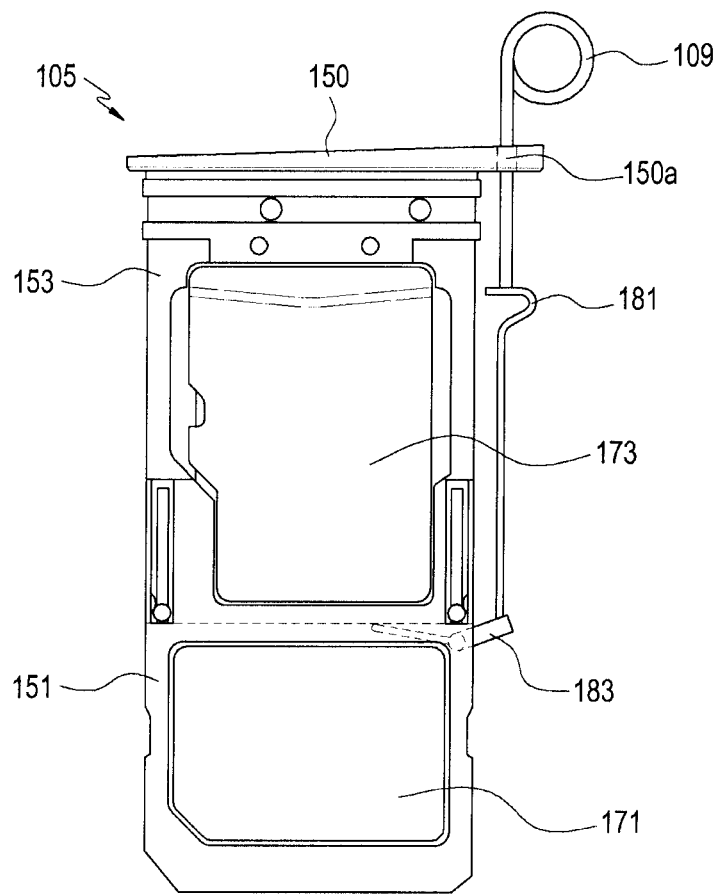
FIG. 8 is a front view illustrating the storage medium accommodation device according to one of various embodiments of the present disclosure, a push bar, and a pin.
Figure 9:
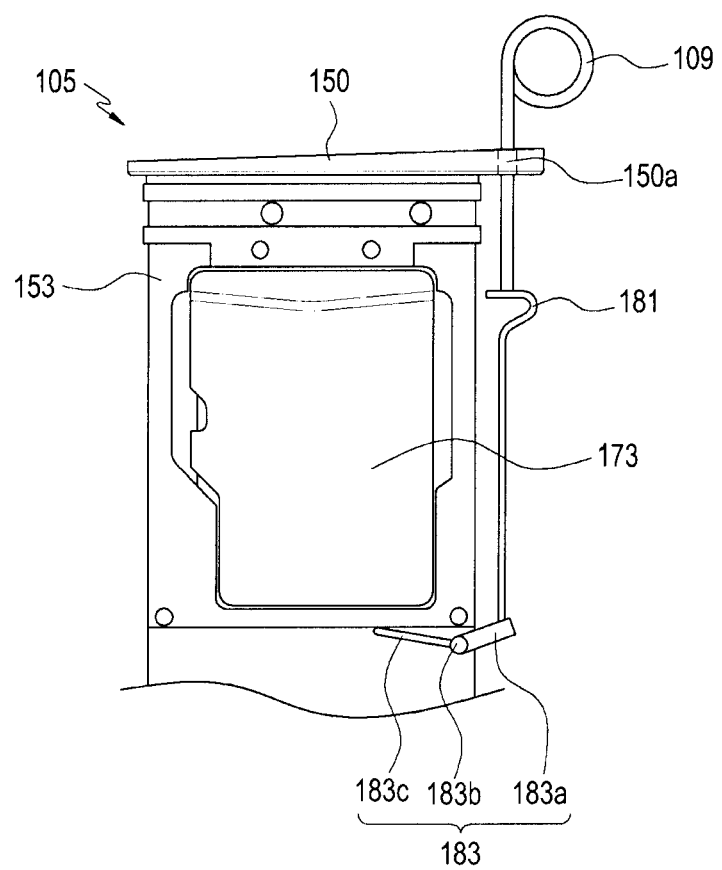
FIG. 9 is a front view illustrating a state in which the push bar is operated in the storage medium accommodation device according to one of various embodiments of the present disclosure.

FIG. 7 is a perspective view illustrating a state in which the storage medium accommodation device is accommodated in an electronic device according to one of various embodiments of the present disclosure. FIG. 8 is a front view illustrating the storage medium accommodation device according to one of various embodiments of the present disclosure, a push bar, and a pin. FIG. 9 is a front view illustrating a state in which the push bar is operated in the storage medium accommodation device according to one of various embodiments of the present disclosure.

Referring to FIGS. 7 to 9, the socket 106 may be mounted in the housing 101 of the electronic device 100 according to one of the various embodiments of the present disclosure in the state of accommodating the storage medium accommodation device 105. According to various embodiments of the present disclosure, a hole 150a may be formed in the head 150 of the storage medium accommodation apparatus 105.

In order to draw out the second tray 153 from the socket 106, the electronic device according to various embodiments of the present disclosure may further include a lever 183. The lever 183 may include a first arm 183a engaged with the push bar 181, a hinge 183b engaged with the socket 106 while being connected to the first arm 183a, and a second arm 183c engaged with the second tray 153. The first arm 183a may be rotated together with the second arm 183c about the hinge 183b.

After the pin 109 is inserted through the hole 150a, the first external force may be applied to the push bar 181 in the first direction. The push bar 181 may receive the first external force from the pin 109 so as to rotate the first arm 183a. As the first arm 183a is rotated, the second arm 183c is rotated about the hinge 183b so as to transfer the first external force to the second tray 153.

In certain embodiments, a sensor can detect the foregoing the first external force.

Even if the first external force is transfer to the second tray 153, the first tray 151 may be maintained in the state in which its movement is restricted in the socket 106.

In this manner, the second tray 153 accommodating the second storage medium 173 can be withdrawn, while maintaining the first tray 151 accommodating the first storage medium 171. This allows the second storage medium 173 to be removed while the first storage medium 171 remains attached. In a case where the first storage medium 171 is a SIM card while the second storage medium 173 is a SD card, the SD card and the SIM card have the same ingress/egress, yet the SD card can be replaced while the SIM card is attached.

Figure 10:
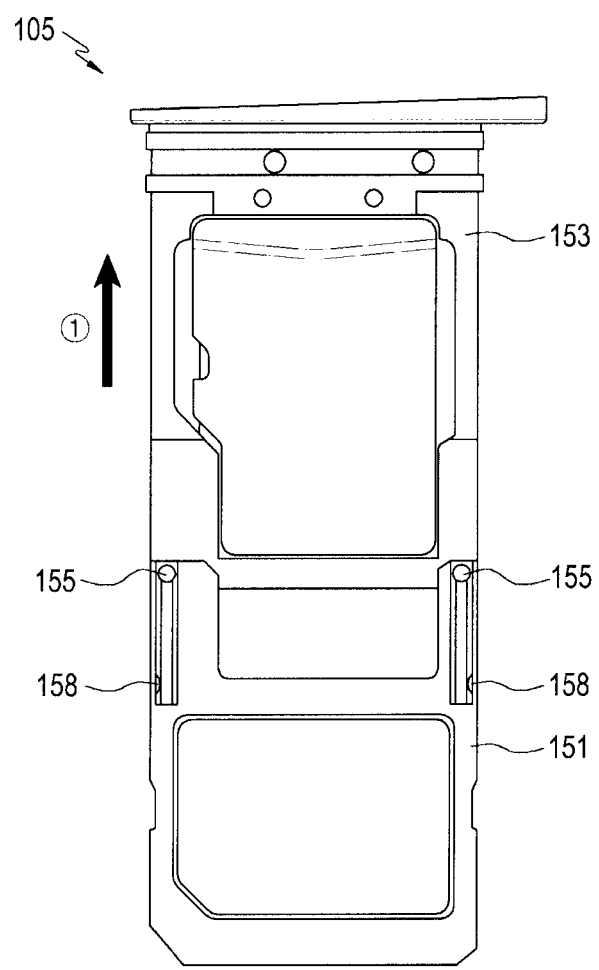
FIG. 10 is a perspective view illustrating a state in which the second tray has been moved in the storage medium accommodation device according to one of various embodiments of the present disclosure.
Figure 11:
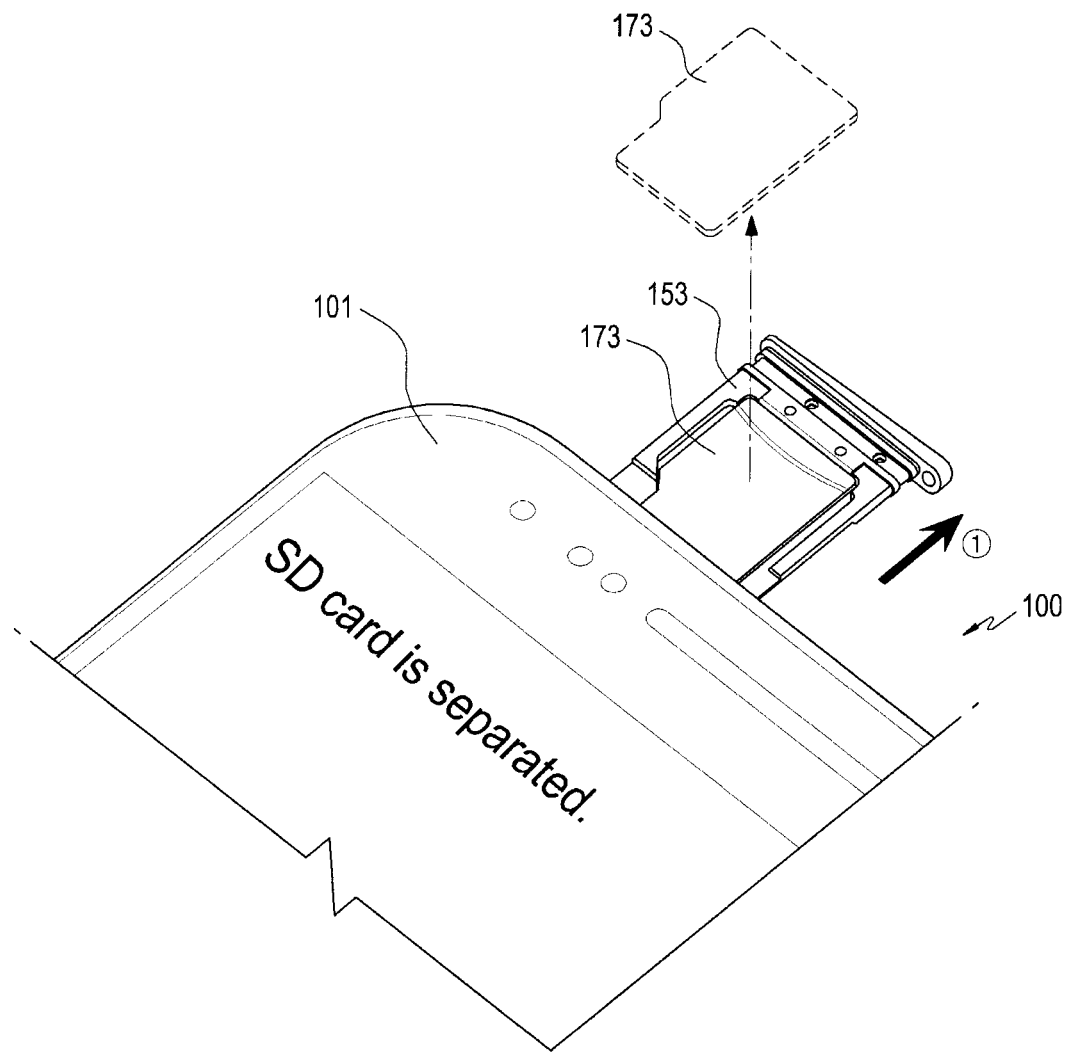
FIG. 11 is a perspective view illustrating a state in which the second tray has been drawn out from the electronic device according to one of various embodiments of the present disclosure.

FIG. 10 is a perspective view illustrating a state in which the second tray has been moved in the storage medium accommodation device according to one of various embodiments of the present disclosure. FIG. 11 is a perspective view illustrating a state in which the second tray has been drawn out from the electronic device according to one of various embodiments of the present disclosure.

Referring to FIGS. 10 and 11, the second tray 153 may be moved in the first direction (marked by reference "①") by the first external force by the push bar 181 (FIG. 9).

The second tray 153 may be moved in the first direction (marked by reference "①") to be drawn out of the housing 101. The second storage medium 173 accommodated in the second tray 153 may be drawn out of the housing 101. The user may separate the second storage medium 173 from the second tray 153.

Even if the first external force is transmitted to the second tray 153, the first tray 151 may be maintained in the state in which its movement is restricted in the socket 106. As the first storage medium 171 accommodated in the first tray 151 is maintained in the state in which its movement is restricted in the socket 106, it is possible to prevent the electronic device 100 from rebooting. The electronic device 100 according to various embodiments of the present disclosure may be configured such that the first storage medium 171 is mounted in the housing 101 while the second storage medium 173 is drawn out of the housing 101.

In accordance with various embodiments of the present disclosure, the processor 12 (FIG. 1) may control the display 16 in such a manner that when the second tray 153 is drawn out of the housing 101, the display 16 displays a state in which the second storage medium (e.g., an SD card) is separated from the housing 101 (e.g., "SD CARD IS SEPARATED"). For example, the sensor can detect that the second tray is removed and generate an interrupt to the processor 12. The processor 12 can executed an interrupt handler causing display of "SD CARD IS SEPARATED." Upon completion of the interrupt handler, the processor 12 can resume operations, including resuming an in progress phone call.

Figure 12:
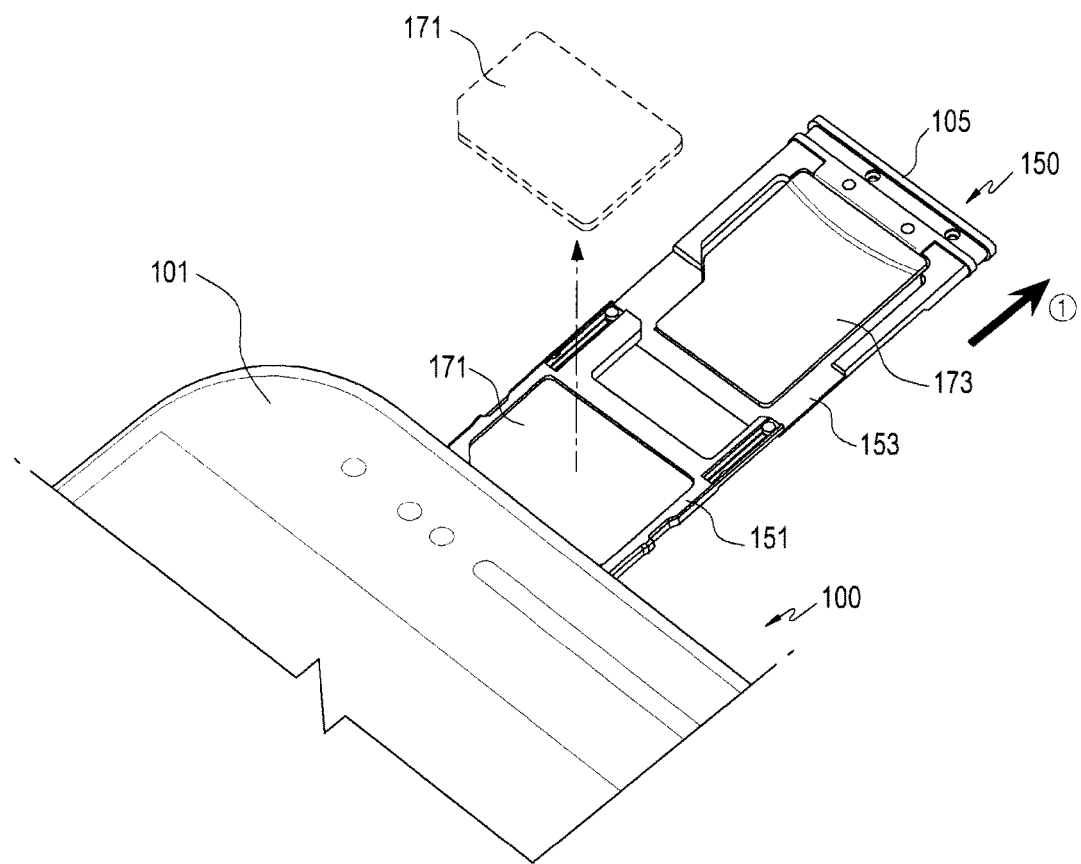
FIG. 12 is a perspective view illustrating a state in which the first storage medium is replaced in the electronic device according to one of various embodiments of the present disclosure.

FIG. 12 is a perspective view illustrating a state in which the storage medium accommodation device has been drawn out of the electronic device according to one of various embodiments of the present disclosure.

Referring to FIG. 12, the user may move the second tray 153 in the first direction (marked with reference ①) by the second external force in the state of holding the head of the second tray 153.

The first tray 151 may be separated from the socket 106 (FIG. 7) by the second external force, and may be drawn out of the housing 101 together with the second tray 153. The user may separate the first storage medium 171 accommodated in the first tray 151 from the first tray 151. Both the first storage medium 171 and the second storage medium 173 use the same ingress and egress.

Figure 13:
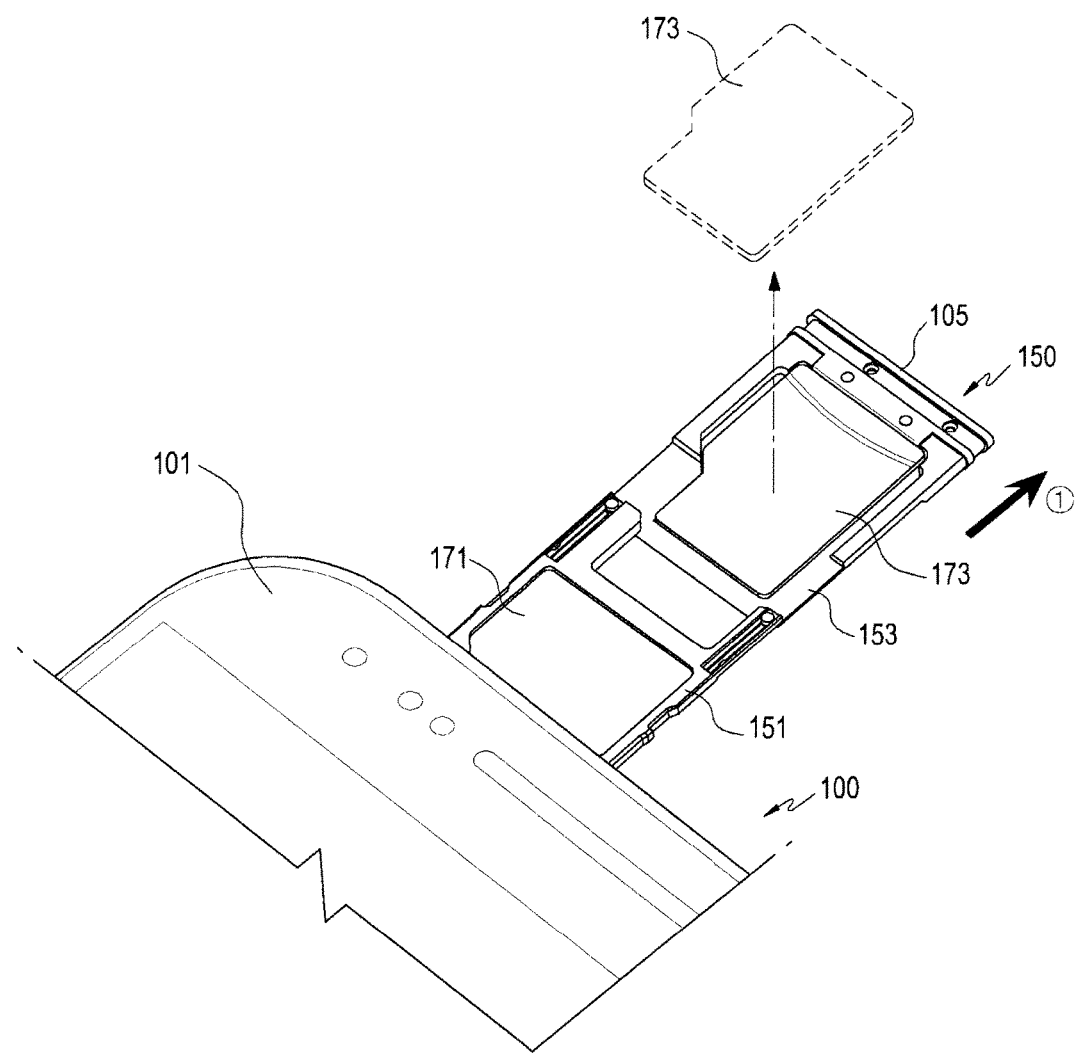
FIG. 13 is a perspective view illustrating a state in which the second storage medium is replaced in the electronic device according to one of various embodiments of the present disclosure.

FIG. 13 is a perspective view illustrating a state in which the second storage medium is replaced in the electronic device according to one of various embodiments of the present disclosure.

Referring to FIG. 13, when the storage medium accommodation device 105 provided in the electronic device according to one of the various embodiments of the present disclosure is drawn out of the housing 101, the user may replace the second storage medium 173 accommodated in the second tray 153. For example, without being limited to the case in which only the second storage medium 173 is replaced when only the second tray 153 is drawn out of the housing 101 by the user, the second storage medium 173 may only be replaced even when the first tray 151 is also drawn out of the housing 101 together with the second tray 153.

Figure 14:
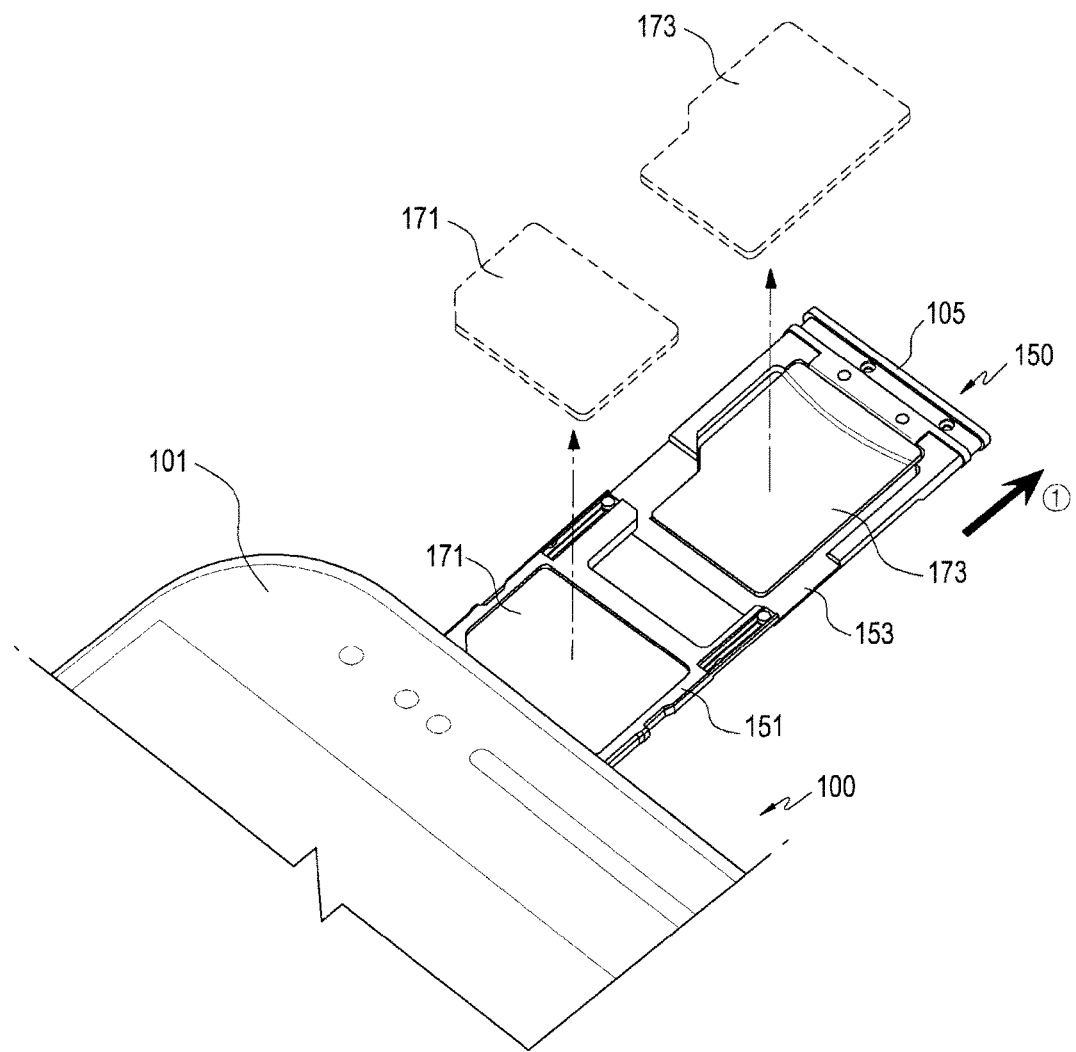
FIG. 14 is a perspective view illustrating a state in which the first and second storage mediums are replaced in the electronic device according to one of various embodiments of the present disclosure.

FIG. 14 is a perspective view illustrating a state in which the first and second storage mediums are replaced in the electronic device according to one of various embodiments of the present disclosure.

Referring to FIG. 14, when the storage medium accommodation device 105 provided in the electronic device according to one of the various embodiments of the present disclosure is drawn out of the housing, the user may replace the first storage medium 171 together with the second storage medium 173 without being limited to the case of replacing only the first storage medium 171.

Figure 15:
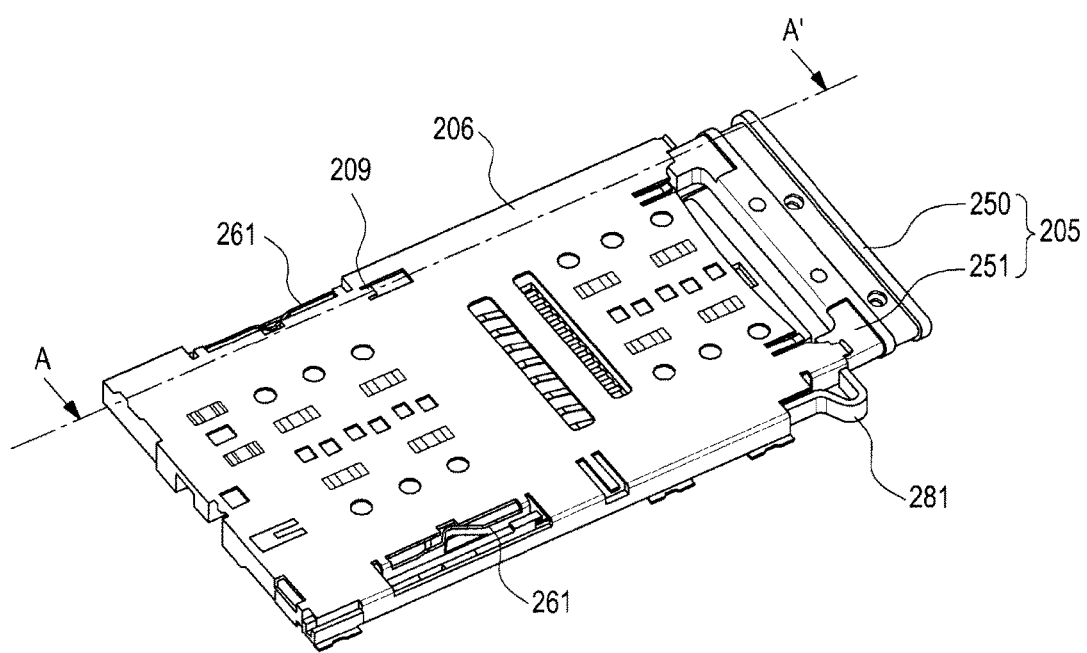
FIG. 15 is a perspective view illustrating a socket and a storage medium accommodation device of an electronic device according to another one of various embodiments of the present disclosure.
Figure 16:
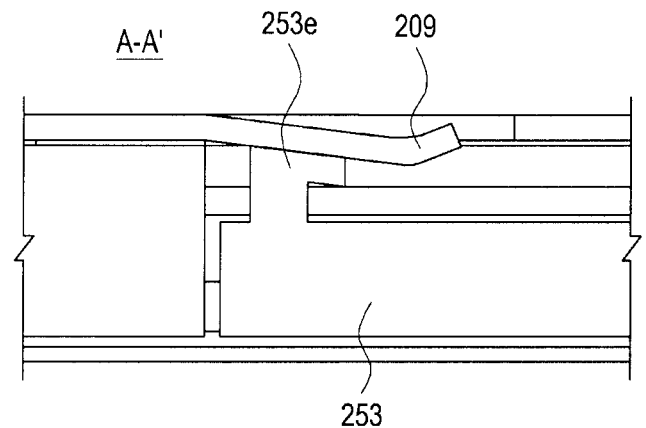
FIG. 16 is a cross-sectional view taken along line A-A' in FIG. 15.

FIG. 15 is a perspective view illustrating a socket and a storage medium accommodation device of an electronic device according to another one of various embodiments of the present disclosure. FIG. 16 is a cross-sectional view taken along line A-A' in FIG. 15.

Referring to FIGS. 15 and 16, the electronic device according to another one of various embodiments of the present disclosure may include a storage medium accommodation device 205, a socket 206, and a push bar 281. When the components according to another one of the various embodiments of the present disclosure are the same as or similar to those of the preceding embodiment, the descriptions thereof will be omitted.

The socket 206 may include a fourth locking portion 209 that causes the second tray 253 to be engaged with the socket 206.

The second tray 253 may include a second guide 253e formed to protrude from one face of the second tray 253. The fourth locking portion 209 may be formed to protrude so as to apply an elastic force to the second guide 253e. As the second guide 253e is fixed by the fourth locking portion 209, the second tray 253 may be engaged with the socket 206.

When the second tray 253 receives a first external force by the push bar 281, the second guide 253e may be unlocked from the fourth locking portion 209. As the second guide 253e is unlocked from the fourth locking portion 209, the second tray 253 may be drawn out of the socket 206.

According to various embodiments of the present disclosure, the fourth locking portion 209 may include a conductive material. The fourth locking portion 209 is electrically connected to the processor 12 (FIG. 1), and the processor 12 (FIG. 1) may determine whether the fourth locking portion 209 and the second tray 253 are separated from each other. For example, when the fourth locking portion 209 is in contact with the second tray 253, the fourth locking portion 209 transmits an electrical signal to the processor 12 (FIG. 1), so that the processor 12 (FIG. 1) may determine that the second tray 153 is engaged with the fourth locking portion 209.

The processor 12 (FIG. 1) controls the display to indicate the state in which the second storage medium is detached from the housing when the fourth locking part 209 and the second tray 253 are separated from each other.

Various embodiments of the present disclosure are not limited to the case in which the fourth locking portion 209 is in contact with the second tray 153, but a separate contact portion may be electrically connected with the processor 12 (FIG. 1) while being in contact with the second tray 153. For example, the contact portion may perform a role of detecting whether the second tray 153 is drawn out of the housing 101.

Figure 17:
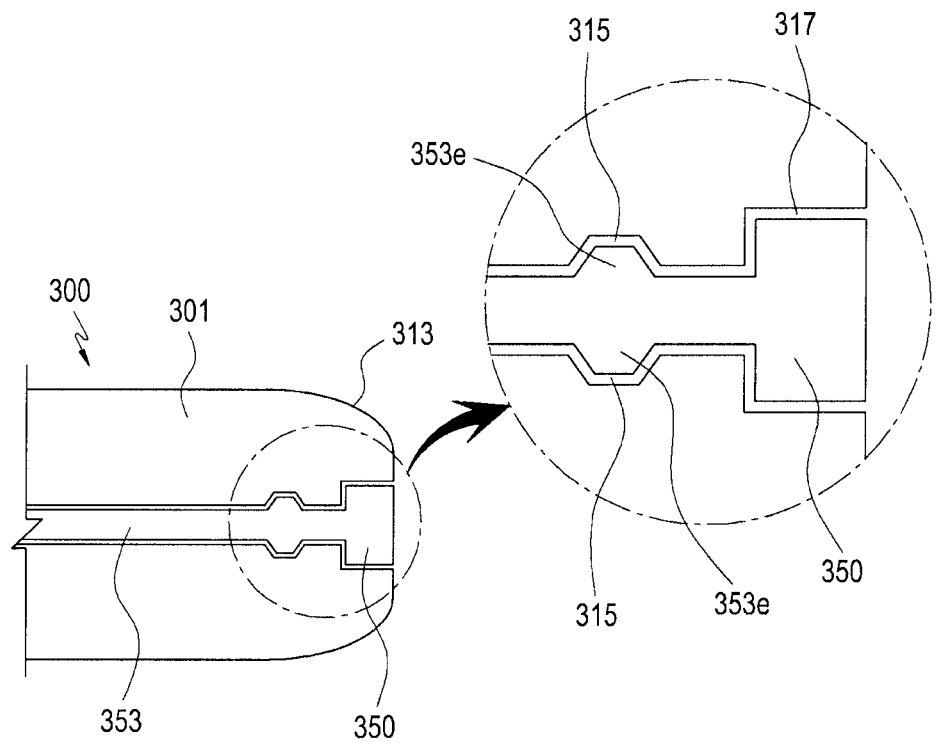
FIG. 17 is a perspective view illustrating an electronic device according to still another one of various embodiments of the present disclosure.

FIG. 17 is a perspective view illustrating an electronic device according to still another one of various embodiments of the present disclosure.

Referring to FIG. 17, the electronic device 300 according to various embodiments of the present disclosure may include a housing 301 and a storage medium accommodation device 350. When the components according to another one of the various embodiments of the present disclosure are the same as or similar to those of the preceding embodiment, the descriptions thereof will be omitted.

An opening 317 may be formed in the top side of the housing 301, so that the storage medium accommodation device 350 may be introduced/drawn out through the opening 317. The housing 301 may include a fifth locking portion 315 that causes the second tray 305 to be engaged therewith.

The fifth locking portion 315 may be formed on an inner wall of the opening 317 in the form of a recess.

The second tray 305 may include a protrusion 353e to be inserted into the fifth locking portion 315. As the protrusion 353e is inserted into the fifth locking portion 315, the second tray 305 may be maintained in the state in which its movement is restricted in the housing 301. The protrusion 353e is in close contact with the fifth locking portion 315 so as to prevent foreign matter (e.g., water) from flowing into the housing 301 through the opening 317.

Figure 18:
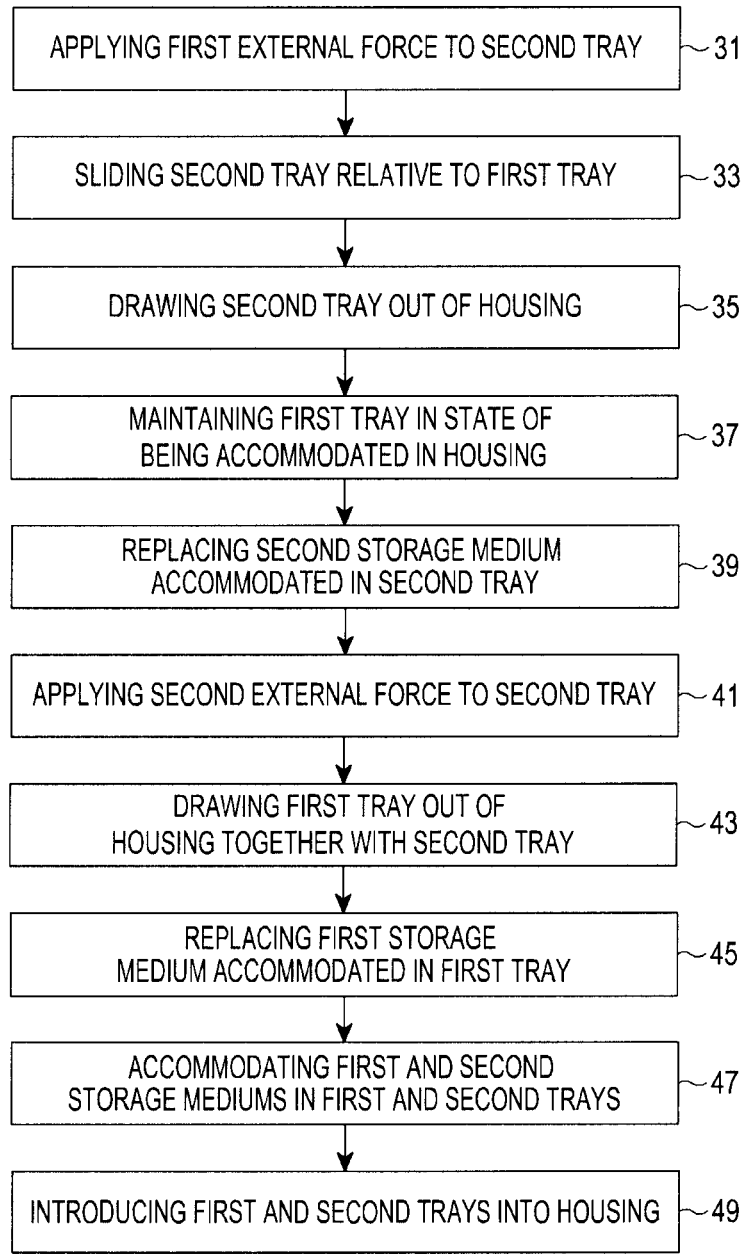
FIG. 18 illustrates a flowchart illustrating a method of operating an electronic device that includes a storage medium according to various embodiments of the present disclosure.

FIG. 18 is a flowchart illustrating a method of operating the electronic device that includes a storage medium according to various embodiments of the present disclosure.

Referring to FIG. 18, an operation method of an electronic device according to various embodiments of the present disclosure includes: applying a first external force to a second tray (operation 31); sliding the second tray relative to the first tray (operation 33); drawing the second tray out of the housing (operation 35); maintaining a first tray in a state of being accommodated in the housing (operation 37); replacing the second storage medium accommodated in the second tray (operation 39); applying a second external force to the second tray (operation 41); drawing the first tray out of the housing together with the second tray (operation 43); replacing the first storage medium accommodated in the first tray (operation 45); causing the first and second storage mediums to be accommodated in the first and second trays, respectively (operation 47); and introducing the first and second trays into the housing (operation 49).

A storage medium accommodation device detachable from/attachable to an electronic device according to various embodiments of the present disclosure may include: a head; a first tray withdrawably introduced into an electronic device and configured to accommodate a first storage medium; a second tray provided between the head and the first tray to be withdrawably introduced into the electronic device, and configured to accommodate a second storage medium; first and second guides respectively provided on the first and second trays, and moved in a sliding manner such that the first and second trays can be introduced into/drawn out from the electronic device; and locking portions respectively included in the first and second guides and configured to restrict the sliding movement of the first and second guides such that the first and second trays can be selectively introduced/drawn out.

According to various embodiments of the present disclosure, the locking portions may include a first locking portion provided on the first guide to restrict the sliding movement of the second guide; and a second locking portion provided on the second guide and engaged with the first locking portion.

According to various embodiments of the present disclosure, the first guide may include a slit formed in a longitudinal direction of the first guide.

According to various embodiments of the present disclosure, the second locking portion may be formed on a face of the second tray to protrude and may be accommodated in the slit.

According to various embodiments of the present disclosure, the second tray may be slid relative to the first tray when the first locking portion is disengaged from the second locking portion by the first external force.

According to various embodiments of the present disclosure, the first storage medium may be a Subscriber Identification Module (SIM) card, and the second storage medium may be a memory card.

According to various embodiments of the present disclosure, there is provided an electronic device that may include: a housing including an opening; a socket provided inside the housing; and a storage medium accommodation device detachably coupled to the socket through the opening. The storage medium accommodation device may include: a head; a first tray withdrawably introduced into of the electronic device and configured to accommodate a first storage medium; a second tray provided between the head and the first tray to be withdrawably introduced into the electronic device, and configured to accommodate a second storage medium; first and second guides respectively provided on the first and second trays, and moved in a sliding manner such that the first and second trays can be introduced into/drawn out from the electronic device; and locking portions respectively included in the first and second guides and configured to restrict the sliding movement of the first and second guides such that the first and second trays can be selectively withdrawn.

According to various embodiments of the present disclosure, the electronic device may further include a hole formed in at least one of the housing and the head and configured to provide a path through which the storage medium accommodation device is operated to be drawn out of the housing.

According to various embodiments of the present disclosure, the electronic device may further include a push bar configured to receive a first external force transmitted from a pin inserted into the hole and to transmit the force such that the second tray is drawn out of the housing.

According to various embodiments of the present disclosure, a face of the head may be flush with an outer face of the housing.

According to various embodiments of the present disclosure, the locking portions may include a first locking portion provided on the first guide to restrict the sliding movement of the second guide; and a second locking portion provided on the second guide and engaged with the first locking portion.

According to various embodiments of the present disclosure, the first guide may include a slit formed in a longitudinal direction of the first guide.

According to various embodiments of the present disclosure, the second tray may be slid relative to the first tray when the first locking portion is disengaged from the second locking portion by the first external force.

According to various embodiments of the present disclosure, the electronic device may further include a third locking portion provided on the socket and configured to fix the first tray, and the first tray may be slid together with the second tray when the first tray is disengaged from the third locking portion by a second external force larger than the first external force.

According to various embodiments of the present disclosure, a latching recess is formed in the first tray and the third locking portion is formed to protrude such that the third locking portion can be inserted into the latching recess.

According to various embodiments of the present disclosure, the electronic device may further include a fourth locking portion provided on the socket and configured to restrict movement of the second guide, and the second guide may be slid relative to the first tray when the second guide is disengaged from the fourth locking portion by the first external force.

According to various embodiments of the present disclosure, the electronic device may further include a display; and a processor configured to control the display, and the processor may control the display in such a manner that the display displays a state in which the second storage medium mounted on the second tray is separated from the housing when the second guide and the fourth locking portion are separated from each other.

According to various embodiments of the present disclosure, there is provided a method of operating an electronic device that includes a storage medium. The method may include: receiving a first external force to a second tray; sliding the second tray relative to a first tray; drawing the second tray out of the housing; maintaining the first tray in a state of being accommodated in the housing; and receiving another second storage medium accommodated in the second tray.

According to various embodiments of the present disclosure, the method of operating an electronic device may further include: receiving a second external force to the second tray; drawing the first tray out of the housing together with the second tray; and receiving another first storage medium accommodated in the first tray.

According to various embodiments of the present disclosure, the method of operating an electronic device may further include causing the first and second storage mediums to be accommodated in the first and second trays, respectively; and introducing the first and second trays into the housing.

According to various embodiments of the present disclosure, there is provided an electronic device comprising: a housing including an opening; a SIM card removably connected to the electronic device through insertion in the opening; an SD memory card removably connected to the electronic device through insertion in the opening, wherein the opening that the memory card is removably connected through insertion is the same opening that the SIM card is removably connected through insertion; one or more processors configured to access cellular services using the SIM card while the SD memory card is removably connected to the electronic device; and wherein the one or more processors are configured to continue access of the cellular services when the SD memory card is removed from the electronic device.

According to various embodiments, the electronic device further comprises a sensor to detect removal of the SD memory card.

According to various embodiments, the electronic device further comprising a display; and wherein the one or more processors cause the display to display a predetermined message when the sensor detects removal of the SD memory card.

While the present disclosure has been shown and described with reference to certain embodiments thereof, it will be understood by those skilled in the art that various changes in form and details may be made therein without departing from the spirit and scope of the present disclosure as defined by the appended claims.

What is claimed is:

1. A storage medium accommodation device comprising:
   a head;
   a first tray withdrawably introduced into an electronic device and configured to accommodate a first storage medium;
   a second tray provided between the head and the first tray to be withdrawably introduced into the electronic device, and configured to accommodate a second storage medium;
   first and second guides respectively provided on the first and second trays, and moved in a sliding manner such that the first and second trays can be introduced into/drawn out from the electronic device; and
   locking portions respectively included in the first and second guides and configured to restrict sliding movement of the first and second guides such that the first and second trays can be selectively withdrawn when the locking portions is engaged or disengaged,
   wherein the locking portions includes a first locking portion and a second locking portion,
   wherein the first locking portion is provided on the first guide and configured to restrict the sliding movement of the second guide when the first locking portion and the second locking portion are engaged, and configured to allow the sliding movement of the second guide when the first locking portion and the second locking portion are disengaged, and wherein the second locking portion is provided on the second guide and configured to engage or disengage the first locking portion.

2. The storage medium accommodation device of claim 1, wherein the first guide includes a slit formed in a longitudinal direction of the first guide.

3. The storage medium accommodation device of claim 2, wherein the second locking portion is formed on a face of the second tray to protrude and is accommodated in the slit.

4. The storage medium accommodation device of claim 3, wherein the second tray is slid relative to the first tray when the first locking portion is disengaged from the second locking portion by a first external force.

5. The storage medium accommodation device of claim 1, wherein the first storage medium is a Subscriber Identification Module (SIM) card, and the second storage medium is a memory card.

6. An electronic device comprising:
a housing including an opening;
a socket provided inside the housing; and
a storage medium accommodation device detachably coupled to the socket through the opening,
wherein the storage medium accommodation device includes:
a head;
a first tray withdrawably introduced into the electronic device and configured to accommodate a first storage medium;
a second tray provided between the head and the first tray withdrawably introduced into the socket, and configured to accommodate a second storage medium;
first and second guides respectively provided on the first and second trays, and moved in a sliding manner such that the first and second trays can be introduced into/drawn out from the socket; and
locking portions respectively included in the first and second guides and configured to restrict sliding movement of the first and second guides such that the first and second trays can be selectively introduced/drawn out when the locking portions is engaged or disengaged,
wherein the locking portions includes a first locking portion and a second locking portion,
wherein the first locking portion is provided on the first guide and configured to restrict the sliding movement of the second guide when the first locking portion and the second locking portion are engaged, and configured to allow the sliding movement of the second guide when the first locking portion and the second locking portion are disengaged, and
wherein the second locking portion is provided on the second guide and configured to engage or disengage the first locking portion.

7. The electronic device of claim 6, wherein the storage medium accommodation device further includes a hole formed in at least one of the housing and the head and configured to provide a path through which the storage medium accommodation device is operated to be drawn out of the housing.

8. The electronic device of claim 7, wherein the storage medium accommodation device further includes a push bar configured to receive a first external force transmitted from a pin inserted into the hole and to transmit the first external force such that the second tray is drawn out of the housing.

9. The electronic device of claim 6, wherein a face of the head is flush with an outer face of the housing.

10. The electronic device of claim 6, wherein the first guide includes a slit formed in a longitudinal direction of the first guide.

11. The electronic device of claim 6, wherein the second tray is slid relative to the first tray when the first locking portion is disengaged from the second locking portion by a first external force.

12. The electronic device of claim 11, further comprising:
a third locking portion provided on the socket and configured to fix the first tray,
wherein the first tray is slid together with the second tray when the first tray is disengaged from the third locking portion by a second external force that is larger than the first external force.

13. The electronic device of claim 12, wherein a latching recess is formed in the first tray and the third locking portion is formed to protrude such that the third locking portion is inserted into the latching recess.

14. The electronic device of claim 6, further comprising:
a fourth locking portion provided on the socket and configured to restrict movement of the second guide,
wherein the second guide is slid relative to the first tray when the second guide is disengaged from the fourth locking portion by a first external force.

15. The electronic device of claim 14, further comprising:
a display and a processor configured to control the display,
wherein the processor controls the display in such a manner that the display displays a state in which the second storage medium mounted on the second tray is separated from the housing when the second guide and the fourth locking portion are separated from each other.

16. A method of operating an electronic device including a storage medium accommodation device, the method including:
receiving a first external force to a second tray;
sliding the second tray relative to a first tray;
drawing the second tray out of a housing;
maintaining the first tray in a state of being accommodated in the housing;
receiving another second storage medium accommodated in the second tray;
receiving a second external force to the second tray;
drawing the first tray out of the housing together with the second tray; and
receiving another first storage medium accommodated in the first tray.

17. The method of claim 16, further comprising:
causing the first and second storage mediums to be accommodated in the first and second trays, respectively; and
introducing the first and second trays into the housing.

* * * * *